(12) United States Patent
Jia et al.

(10) Patent No.: US 10,263,017 B2
(45) Date of Patent: Apr. 16, 2019

(54) PIXEL STRUCTURE, DISPLAY PANEL AND MANUFACTURING METHOD OF PIXEL STRUCTURE

(71) Applicants: BOE Technology Group Co., Ltd., Beijing (CN); Hefei Xinsheng Optoelectronics Technology Co., Ltd., Anhui (CN)

(72) Inventors: Weihua Jia, Beijing (CN); Haipeng Yang, Beijing (CN); Jaikwang Kim, Beijing (CN); Yongjun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 293 days.

(21) Appl. No.: 15/113,542

(22) PCT Filed: Oct. 16, 2015

(86) PCT No.: PCT/CN2015/092075
§ 371 (c)(1),
(2) Date: Jul. 22, 2016

(87) PCT Pub. No.: WO2017/000425
PCT Pub. Date: Jan. 5, 2017

(65) Prior Publication Data
US 2017/0148818 A1    May 25, 2017

(30) Foreign Application Priority Data
Jun. 29, 2015   (CN) .......................... 2015 1 0375221

(51) Int. Cl.
*H01L 27/12*       (2006.01)
*H01L 29/786*      (2006.01)
(Continued)

(52) U.S. Cl.
CPC ...... *H01L 27/124* (2013.01); *G02F 1/136286* (2013.01); *H01L 27/1262* (2013.01);
(Continued)

(58) Field of Classification Search
CPC ........................... G02F 1/1343; H01L 27/124
See application file for complete search history.

(56) References Cited

U.S. PATENT DOCUMENTS 8,780,308 B2   7/2014   Li et al.
2003/0133066 A1   7/2003   Ono et al.
(Continued)

FOREIGN PATENT DOCUMENTS

CN   1432855 A   7/2003
CN   102237355 A   11/2011
(Continued)

OTHER PUBLICATIONS

International Search Report and Written Opinion for International Application No. PCT/CN2015/092075, dated Mar. 24, 2016, 14 pages.
(Continued)

*Primary Examiner* — Thomas L Dickey
(74) *Attorney, Agent, or Firm* — Westman, Champlin & Koehler, P.A.

(57) ABSTRACT

A pixel structure, a display panel and a manufacturing method of the pixel structure are disclosed. The pixel structure includes: gate lines extending in parallel in a first direction; data lines extending in parallel in a second direction; and a plurality of pixel units defined by the gate lines and the data lines. One of the data lines is disposed between
(Continued)

two pixel units which are adjacent to each other in the first direction, and two of the gate lines are disposed between two pixel units which are adjacent to each other in the second direction. Each of the pixel units comprises two pixel regions which are arranged side by side in the first direction, each of the pixel regions comprises a pixel electrode, and each of the pixel units comprises a unitary common electrode which covers the two pixel regions.

18 Claims, 10 Drawing Sheets

(51) Int. Cl.
  *G02F 1/1362* (2006.01)
  *G09G 3/36* (2006.01)
  *G02F 1/1343* (2006.01)
(52) U.S. Cl.
  CPC ........... *H01L 29/78672* (2013.01); *G02F 2001/134318* (2013.01); *G02F 2001/134345* (2013.01); *G09G 3/3607* (2013.01); *G09G 3/3648* (2013.01); *G09G 2300/0426* (2013.01); *G09G 2300/0452* (2013.01); *G09G 2320/0233* (2013.01)

(56) References Cited

U.S. PATENT DOCUMENTS

| | | |
|---|---|---|
| 2005/0092991 A1 | 5/2005 | Ahn et al. |
| 2005/0140903 A1 | 6/2005 | Park et al. |
| 2013/0265514 A1* | 10/2013 | Li ..................... G02F 1/1343 349/41 |
| 2014/0036188 A1 | 2/2014 | Chen |
| 2015/0009439 A1 | 1/2015 | Morita et al. |
| 2015/0035167 A1 | 2/2015 | Wang et al. |
| 2015/0061986 A1 | 3/2015 | Song et al. |
| 2015/0236042 A1 | 8/2015 | Peng et al. |

FOREIGN PATENT DOCUMENTS

| | | |
|---|---|---|
| CN | 102621757 A | 8/2012 |
| CN | 103163698 A | 6/2013 |
| CN | 103163701 A | 6/2013 |
| CN | 202975548 U | 6/2013 |
| CN | 103336392 A | 10/2013 |
| CN | 103943627 A | 7/2014 |
| CN | 104730781 A | 6/2015 |
| CN | 104795405 A | 7/2015 |
| CN | 104880873 A | 9/2015 |

OTHER PUBLICATIONS

English translation of Box No. V of the Written Opinion of the International Searching Authority for International Application No. PCT/CN2015/092075, 2 pages.
First Office Action for Chinese Patent Application No. 201510375221.1, dated May 17, 2017, pp. 17.
Second Office Action, including Search Report, for Chinese Patent Application No. 201510375221.1, dated Feb. 8, 2018, 23 pages.
Third Office Action, including Search Report, for Chinese Patent Application No. 201510375221.1, dated Sep. 7, 2018, 22 pages.

* cited by examiner

PIXEL STRUCTURE, DISPLAY PANEL AND MANUFACTURING METHOD OF PIXEL STRUCTURE

CROSS-REFERENCE TO RELATED APPLICATION

This application is a Section 371 National Stage Application of International Application No. PCT/CN2015/092075, filed on Oct. 16, 2015, entitled "PIXEL STRUCTURE, DISPLAY PANEL AND MANUFACTURING METHOD OF PIXEL STRUCTURE", which has not yet published, which claims priority to Chinese Application No. 201510375221.1, filed on Jun. 29, 2015, incorporated herein by reference in their entirety.

BACKGROUND OF THE INVENTION

Field of the Invention

Embodiments of the present disclosure relate to a field of display technology, in particular, to a dual-gate driving pixel structure, a display panel comprising the pixel structure and a manufacturing method of the pixel structure.

Description of the Related Art

In a liquid crystal display, a dual-gate driving pixel structure has been proposed in order to reduce the number of driving chips so as to reduce cost. Compared to a common single-gate driving pixel structure, the number of gate lines is doubled while the number of data lines is halved. However, there is a following problem in the display having such a dual-gate driving pixel structure: as adjacent pixels in the same row are driven by gate lines in different rows, adjacent columns of pixels present different gray scales, resulting in a brightness variance in display image, and as human eyes are most sensitive to a flashing green sub-pixel, a number of lines in low gray level may be felt.

SUMMARY OF THE INVENTION

The present disclosure is intended to solve at least one of the above defects in prior art.

According to an aspect of the present disclosure, it is provided a pixel structure, comprising:

a plurality of gate lines extending in parallel in a first direction;

a plurality of data lines extending in parallel in a second direction; and a plurality of pixel units defined by the plurality of gate lines and the plurality of data lines, wherein, one of the data lines is disposed between each two pixel units which are adjacent to each other in the first direction, and two of the gate lines are disposed between each two pixel units which are adjacent to each other in the second direction; and wherein, each of the pixel units comprises two pixel regions which are arranged side by side in the first direction, each of the pixel regions comprises a pixel electrode, and each of the pixel units comprises a unitary common electrode which covers the two pixel regions.

According to an embodiment, each of the pixel units comprises a first common electrode line extending in the first direction and a second common electrode line extending in the second direction, the first common electrode line and the second common electrode line are electrically connected with each other at their intersection point; and wherein, the first common electrode lines of the pixel units which are adjacent to each other in the first direction are electrically connected with each other, and the second common electrode lines of the pixel units which are adjacent to each other in the second direction are electrically connected with each other.

According to an embodiment, the pixel structure further comprises a first metal layer, a pixel electrode layer and an insulation layer between the first metal layer and the pixel electrode layer, wherein the first common electrode line, the second common electrode line and the gate line are positioned in the first metal layer, the pixel electrode is positioned in the pixel electrode layer, the first common electrode lines of the pixel units which are adjacent to each other in the first direction extend continuously in the first metal layer, so as to be electrically connected with each other, and the second common electrode lines of the pixel units which are adjacent to each other in the second direction are broken off by the gate lines, the second common electrode lines of the pixel units which are adjacent to each other in the second direction are electrically connected with each other through a via-hole in the insulation layer and a connecting line in the pixel electrode layer, and the connecting line spans the gate lines between the two pixel units which are adjacent to each other in the second direction.

According to an embodiment, the connecting line is formed from the same material as the pixel electrode.

According to an embodiment, the first common electrode line, the second common electrode and the gate line are formed from the same material.

According to an embodiment, the common electrode is positioned in a common electrode layer, the first common electrode line and the second common electrode are electrically connected with the common electrode, respectively.

According to an embodiment, the first common electrode line is arranged in the first direction at an edge of each of the pixel units, and the second common electrode line is arranged in the second direction at a boundary between two pixel regions.

According to an embodiment, each of the pixel regions comprises a thin film transistor, a gate electrode of each thin film transistor is electrically connected with a gate line, a source electrode of each thin film transistor is electrically connected with a data line, and a drain electrode of each thin film transistor is electrically connected with a pixel electrode of the pixel region where the thin film transistor is located through a via-hole, and the gate electrodes of the respective thin film transistors in the two pixel regions of each pixel unit are electrically connected with the gate lines at two sides of the pixel unit, respectively.

According to an embodiment, the respective thin film transistors in the two pixel regions of each pixel unit are diagonally arranged at two corners of the pixel unit.

According to an embodiment, the pixel structure further comprises a second metal layer formed between the first metal layer and the pixel electrode layer, wherein the data line, the source electrode and the drain electrode of the thin film transistor are positioned in the second metal layer.

According to an embodiment, an insulation layer is provided between the first metal layer and the second metal layer and between the second metal layer and the pixel electrode layer, respectively.

According to an embodiment, the first common electrode lines of the respective pixel units are aligned with each other, and the second common electrode lines of the respective pixel units are aligned with each other.

According to another aspect, it is provided a display panel comprising the pixel structure according to any one of the above embodiments.

According to a further aspect of the present disclosure, it is provided a manufacturing method of a pixel structure, comprising:

providing a substrate;

forming a common electrode layer on the substrate, and patterning the common electrode layer to form a common electrode;

forming a first metal layer on the common electrode layer, and patterning the first metal layer to form a plurality of gate lines extending in parallel in a first direction, a plurality of first common electrode lines extending in the first direction and a plurality of second common electrode lines extending in a second direction, wherein the first common electrode lines and the second common electrode lines are electrically connected with each other at their intersection points;

forming a first insulation layer on the first metal layer;

forming a second metal layer on the first insulation layer, and patterning the second metal layer to form a plurality of data lines extending in parallel in the second direction;

forming a second insulation layer on the second metal layer; and forming a transparent pixel electrode layer on the second insulation layer, and patterning the pixel electrode layer to form a pixel electrode; wherein, the plurality of gate lines and the plurality of data lines define a plurality of pixel units, one of the data lines is disposed between each two pixel units which are adjacent to each other in the first direction, and two of the gate lines are disposed between each two pixel units which are adjacent to each other in the second direction; and wherein, each of the pixel units comprises two pixel regions which are arranged side by side in the first direction, each of the pixel regions comprises a pixel electrode, and each of the pixel units comprises a unitary common electrode which covers the two pixel regions.

According to an embodiment, each of the pixel units comprises a corresponding first common electrode line and a corresponding the second common electrode line; and wherein, the first common electrode lines of the pixel units which are adjacent to each other in the first direction are electrically connected with each other, and the second common electrode lines of the pixel units which are adjacent to each other in the second direction are electrically connected with each other.

According to an embodiment, the manufacturing method further comprises: forming a source electrode and a drain electrode of a thin film transistor while patterning the second metal layer to form the data line.

According to an embodiment, the manufacturing method further comprises: patterning the second insulation layer to form a first via-hole which penetrates the first insulation layer and the second insulation layer and a second via-hole which penetrates the second insulation layer to connect the drain electrode of the thin film transistor with the pixel electrode.

According to an embodiment, the manufacturing method further comprises: forming a connecting line while patterning the pixel electrode layer to form the pixel electrode, wherein the connecting line spans the gate lines between the pixel units which are adjacent to each other in the second direction.

According to an embodiment, the first common electrode lines of the pixel units which are adjacent to each other in the first direction extend continuously in the first metal layer, so as to be electrically connected with each other, and the second common electrode lines of the pixel units which are adjacent to each other in the second direction are broken off by the gate lines, and are electrically connected with each other through the first via-hole which penetrates the first insulation layer and the second insulation layer and the connecting line in the pixel electrode layer.

According to an embodiment, the first common electrode line and the second common electrode line are formed such that the first common electrode line and the second common electrode line contact electrically with the common electrode, respectively.

In the embodiments of the present disclosure, the common electrodes of adjacent pixels in each pixel unit are connected together so that common voltage of the adjacent pixels may be balanced, in particular, a brightness variance in low gray scale and a flashing defect due to a difference in common voltage between adjacent pixels may be alleviated or eliminated, thereby improving a product quality.

Further, the common electrode lines formed of gate metal layer extend in the horizontal and vertical directions to form a common electrode line grid in a display region, so as to reduce an integral resistance in a display panel and improve a distribution of integral common electrode resistances in the display panel, thereby improving a product quality, in particular, alleviating or eliminating some defects such as greenish, image sticking defects, or the like.

In order to make objects, features and advantages of the present disclosure become more apparent, it will be further described in combination with the accompanying drawings and specific embodiments below.

DETAILED DESCRIPTION OF PREFERRED EMBODIMENTS OF THE INVENTION

In the following detailed description, in order to facilitate the explanation, a number of specific details are explained to provide a comprehensive understanding to the embodiments of the present disclosure. However, it is obvious that one or more embodiments may be implemented without these specific details. In other cases, conventional structures and devices are shown in schematic diagrams to simplify the drawings. Moreover, the expression "disposed on", "provided on" or "arranged on" used in the specification may be meant that a component is disposed directly on another component, or that a component is disposed above another component and there is an intermediate component between the two components.

Figure 1:
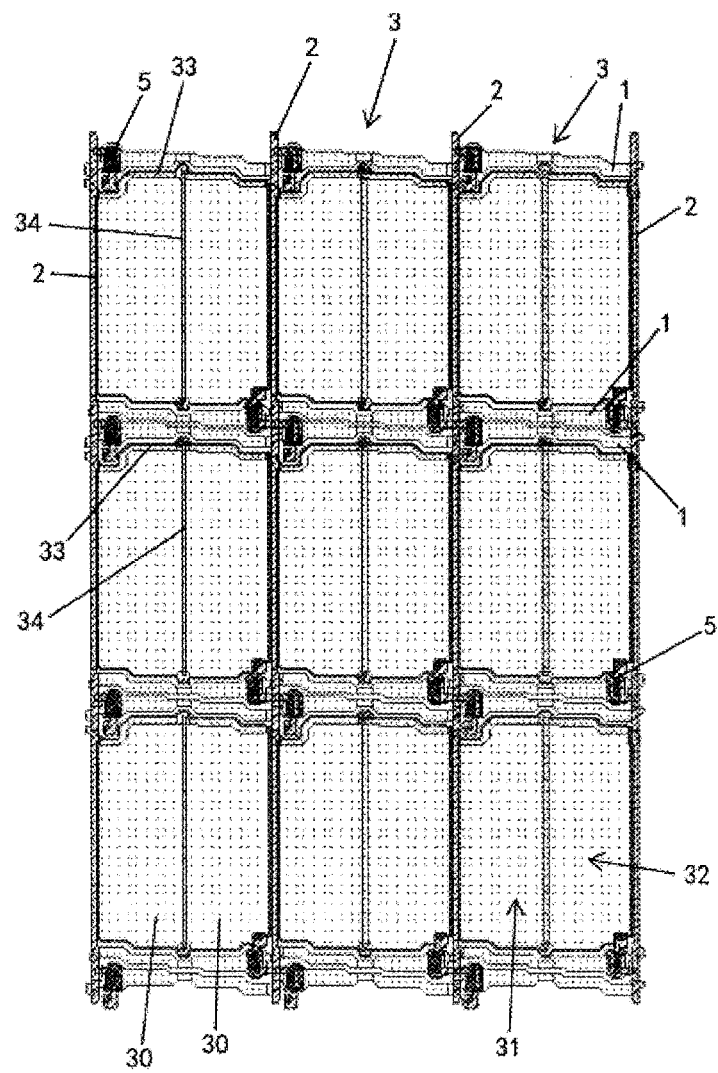
FIG. 1 is a schematic view of a pixel structure according to an embodiment of the present disclosure.

FIG. 1 is a schematic view of a pixel structure according to an embodiment of the present disclosure. As shown in FIG. 1, the pixel structure comprises a plurality of gate lines 1 extending in parallel in a horizontal direction (a first direction) in FIG. 1, and a plurality of data lines 2 extending in parallel in a vertical direction (a second direction) in FIG. 1. The plurality of gate lines 1 and the plurality of data lines 2 together define a plurality of pixel units 3. One data line 2 is provided between each two pixel units 3 which are adjacent to each other in the horizontal direction, and two gate lines 1 are provided between each two pixel units 3 which are adjacent to each other in the vertical direction. It should be noted that only a part of pixel units 3 are shown in FIG. 1, those skilled in the art can understand that the pixel structures as shown in FIG. 1 may extend in both horizontal and vertical directions.

Figure 2:
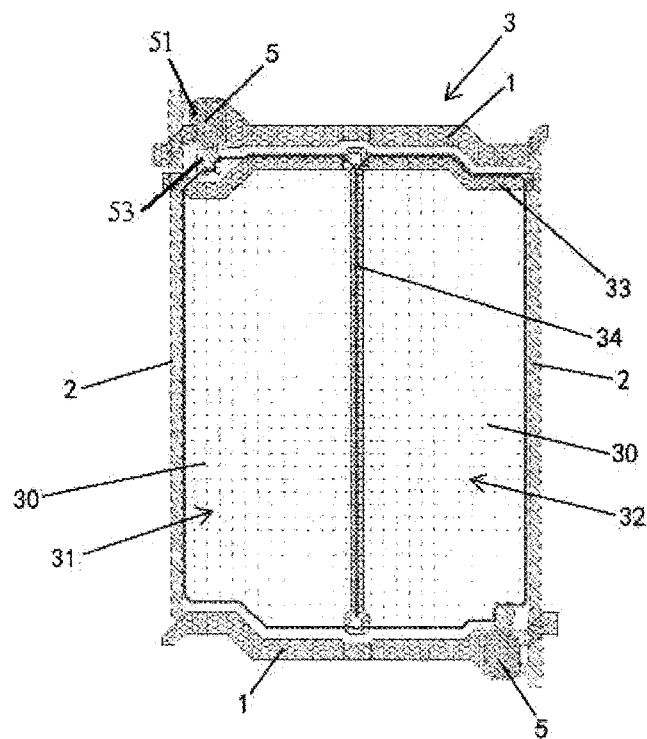
FIG. 2 is an enlarged view of one pixel unit in FIG. 1.
Figure 3:
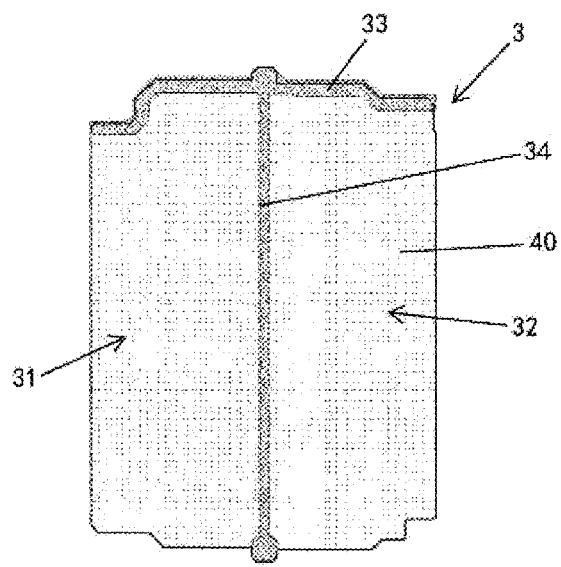
FIG. 3 is a schematic view showing a position relationship between a common electrode and a common electrode line of the pixel unit in FIG. 2.

FIG. 2 is an enlarged view of one pixel unit 3 in FIG. 1, and FIG. 3 is a schematic view showing a position relationship between a common electrode and a common electrode line of the pixel unit 3 in FIG. 2. As shown in FIG. 2, each pixel unit 3 comprises two pixel regions 31, 32 arranged side by side in the horizontal direction, and each of the pixel regions comprises a pixel electrode 30. The pixel electrode 30 may be one of red pixel, green pixel and blue pixel. For example, the pixel region 31 may comprise a red pixel electrode, and the pixel region 32 may comprise a green pixel electrode.

As shown in FIG. 3, each pixel unit 3 may further comprise a unitary common electrode 40 which covers the two pixel regions 31, 32, that is, common electrodes of the two pixel regions 31, 32 are connected with each other so as to form a unitary common electrode.

Moreover, as shown in FIG. 3, each pixel unit 3 may comprise a first common electrode line 33 extending in the horizontal direction and a second common electrode line 34 extending in the vertical direction. The first common electrode line 33 and the second common electrode line 34 are electrically connected with each other at their intersection point.

As shown in FIG. 1, the first common electrode lines 33 of the pixel units 3 which are adjacent to each other in the horizontal direction are electrically connected to each other, and the second common electrode lines 34 of the pixel units 3 which are adjacent to each other in the vertical direction are electrically connected to each other. According to the embodiment as shown in FIG. 1, the first common electrode lines 33 of all the pixel units 3 are aligned with each other and the second common electrode lines 34 of all the pixel units 3 are aligned with each other so as to form a common electrode line grid.

FIGS. 4-8 are schematic views showing processes for manufacturing the pixel structure in FIG. 1 according to an embodiment of the present disclosure.

Figure 5:
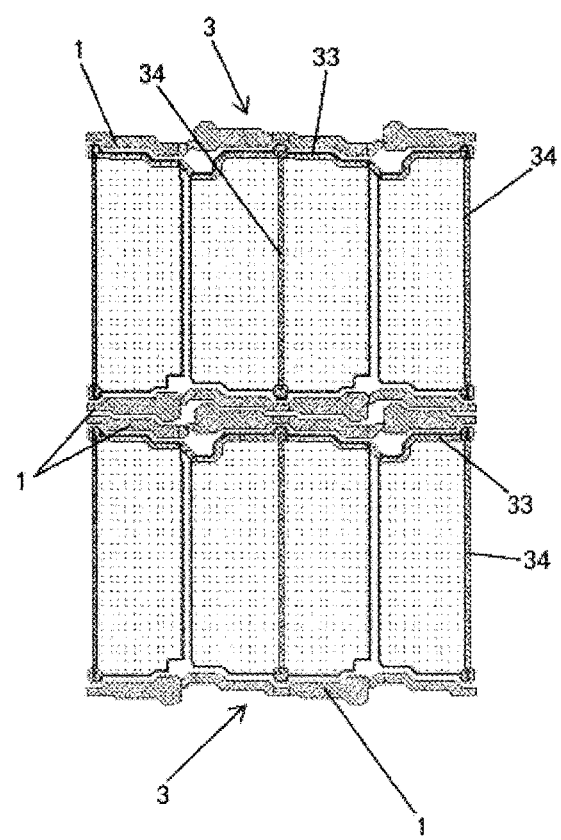
Figure 7:
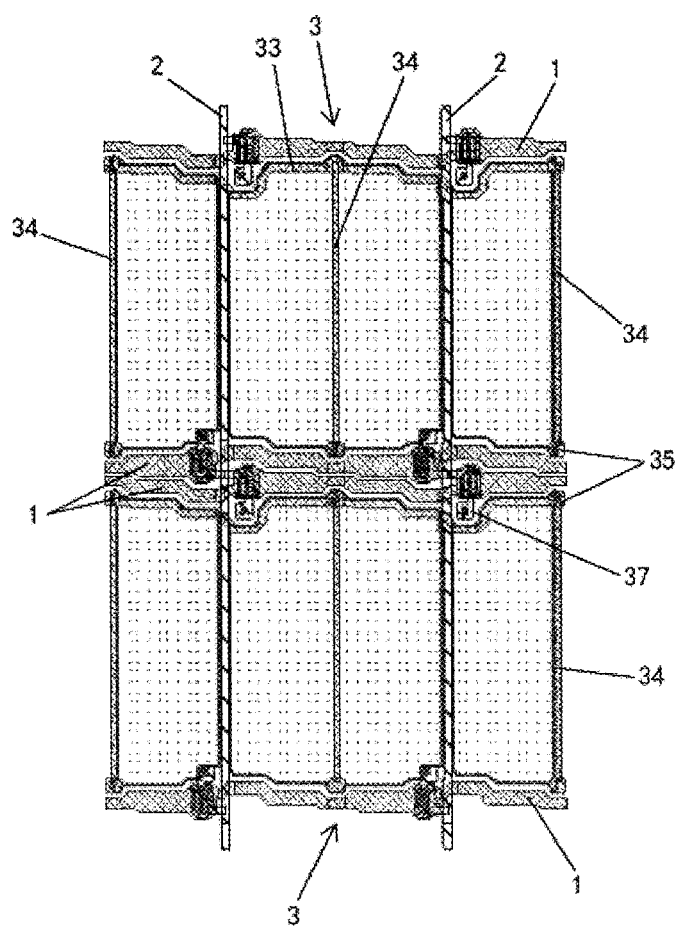
Figure 8:
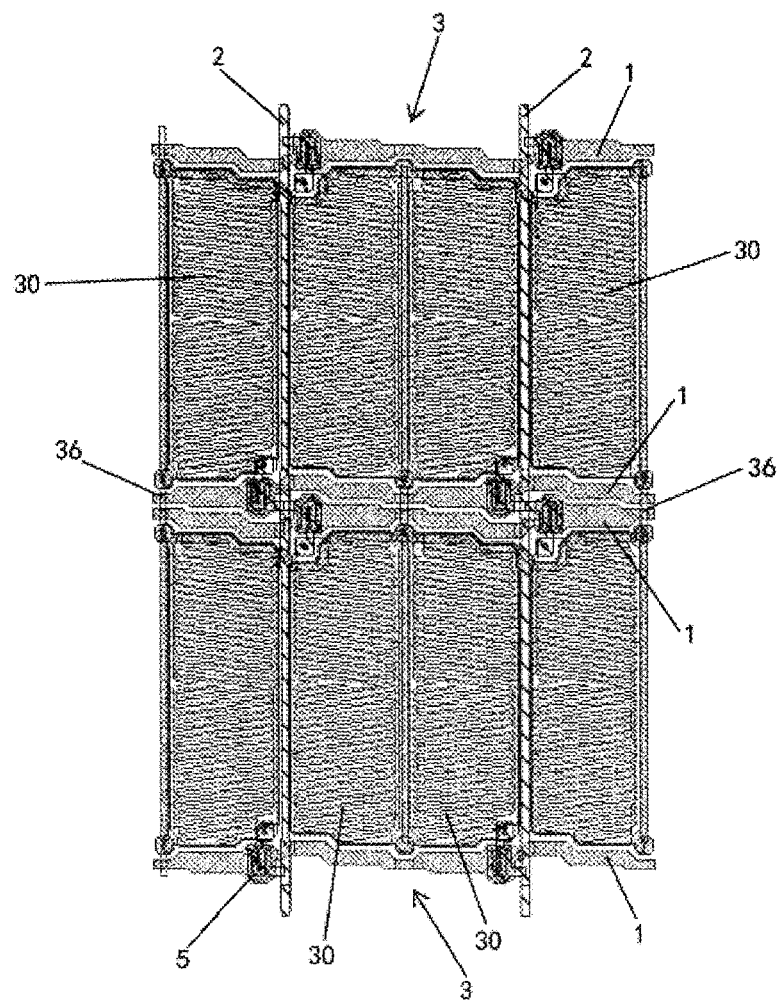

According to the embodiment, the pixel structure as shown in FIG. 1 may comprise a first metal layer, a pixel electrode layer and an insulation layer between the first metal layer and the pixel electrode layer. The first common electrode line 33, the second common electrode line 34 and the gate line 1 are positioned in the first metal layer. The pixel electrode 30 is positioned in the pixel electrode layer. Correspondingly, the first common electrode lines 33 of the pixel units 3 which are adjacent to each other in the horizontal direction extend continuously in the first metal layer so as to be electrically connected with each other, while the second common electrode lines 34 of the pixel units 3 which are adjacent to each other in the vertical direction are broken off by the gate line 1, as shown in FIG. 5. the second common electrode lines 34 of the pixel units 3 which are adjacent to each other in the vertical direction may be electrically connected with each other through a via-hole 35 (as shown in FIG. 7) in the insulation layer and a connecting line 36 in the pixel electrode layer. The connecting line 36 spans the gate lines 1 between the two pixel units which are adjacent to each other in the vertical direction, as shown in FIG. 8.

As the first common electrode line 33, the second common electrode line 34 and the gate line 1 are formed in the same metal layer, they may be formed from the same conductive metal material such as copper, chromium or the like, through one patterning process. Similarly, as the connecting line 36 is formed in the pixel electrode layer, in an embodiment, the connecting line 36 and the pixel electrode 30 may be formed from the same material such as ITO, through one patterning process.

According to an embodiment, the pixel structure in FIG. 1 may further comprise a common electrode layer which is positioned at a side of the first metal layer opposite to the pixel electrode layer. As shown FIGS. 3 and 4, the common electrode 40 is positioned in the common electrode layer, the first common electrode line 33 and the second common electrode line 34 are directly formed on the common electrode 40 so as to form an electrical connection with the common electrode 40 through conductive contact.

As shown in FIGS. 1-3, particularly FIG. 3, according to an embodiment, the first common electrode line 33 is arranged at an edge of each pixel unit 3 in the horizontal direction. In the illustrated embodiment, the first common electrode line 33 is arranged at a top edge of the pixel unit 3, however, it may also be arranged at a bottom edge of the pixel unit 3. The second common electrode line 34 may be vertically arranged at a boundary between the two pixel regions 31, 32.

Figure 6:
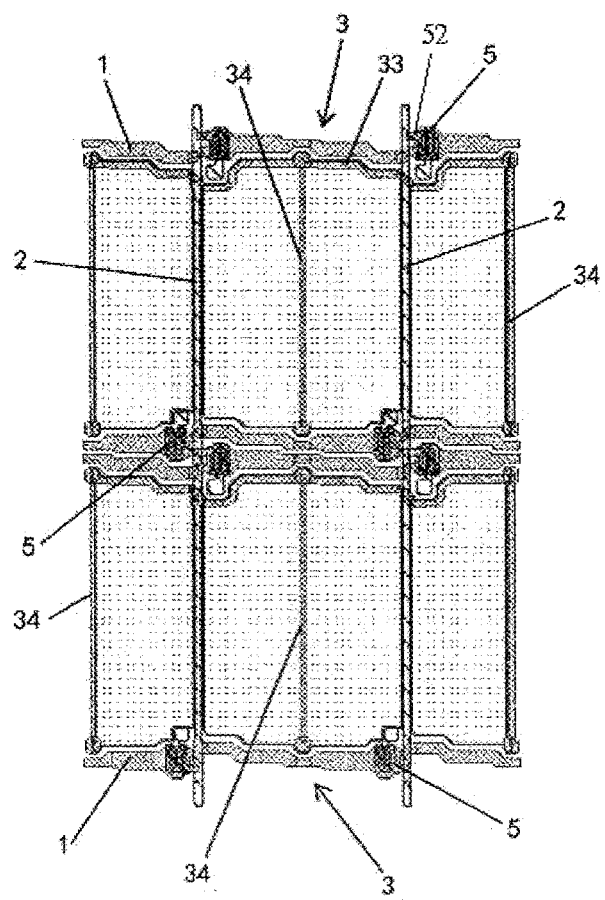

As shown in FIGS. 1, 2 and 6, the pixel regions 31, 32 each may comprise a thin film transistor (TFT) 5. A gate electrode 51 of each TFT 5 is electrically connected with one gate line 1, as shown in FIG. 2; a source electrode 52 of each TFT 5 is electrically connected with one data line 2, as shown in FIG. 6; and a drain electrode 53 of each TFT 5 is electrically connected with a pixel electrode 30 of the pixel region 31 or 32 where the TFT is located, as shown in FIG. 2. The gate electrodes of The TFTs 5 in the two pixel regions 31, 32 of each pixel unit 3 are electrically connected with the gate lines 1 at two sides of the pixel unit 3, respectively. For example, the gate electrode of the TFT 5 in the pixel region 31 is electrically connected with the gate line 1 at an upper side of the pixel unit 3, and the gate electrode of the TFT 5 in the pixel region 32 is electrically connected with the gate line 1 at a lower side of the pixel unit 3.

As shown in FIG. 2, in order to facilitate connecting with the gate line 1 and the data line 2, according to an embodiment, the respective TFTs 5 in the two pixel regions 31, 32 of each pixel unit 3 are diagonally arranged at two corners of the pixel unit 3. For example, the TFT 5 in the pixel region 31 is arranged at a top left corner of the pixel unit 3, and the TFT 5 in the pixel region 32 is arranged at a bottom right corner of the pixel unit 3.

According to an embodiment, the pixel structure as shown in FIG. 1 may further comprise a second metal layer formed between the first metal layer and the pixel electrode layer. The data line 2, the source electrode and the drain electrode of the TFT 5 are positioned in the second metal layer, as shown in FIG. 6.

Further, a gate insulation layer formed from insulation material such as silicon nitride or the like may be provided between the first metal layer and the second metal layer, and a passivation layer formed from insulation material such as silicon nitride or the like may be provided between the second metal layer and the pixel electrode layer.

According to another aspect of the present disclosure, it is provided a display panel comprising the pixel structure according to any one of the above embodiments. The display panel may further comprise some known structures, such as color filter substrate or the like, which are omitted herein. The display panel according to the embodiment of the present disclosure may be used in various display devices, such as television, computer, mobile phone, digital camera, etc.

FIGS. 9-17 are schematic cross-section views showing various layers of the pixel structure formed in various steps of the manufacturing method of the pixel structure according to an embodiment of the present disclosure. Processes for manufacturing the pixel structure in FIG. 1 will be specifically described with reference to FIGS. 4-17. It should be noted that FIGS. 4-17 merely show a part of processes for manufacturing the pixel structure in FIG. 1, rather than all the processes.

Figure 4:
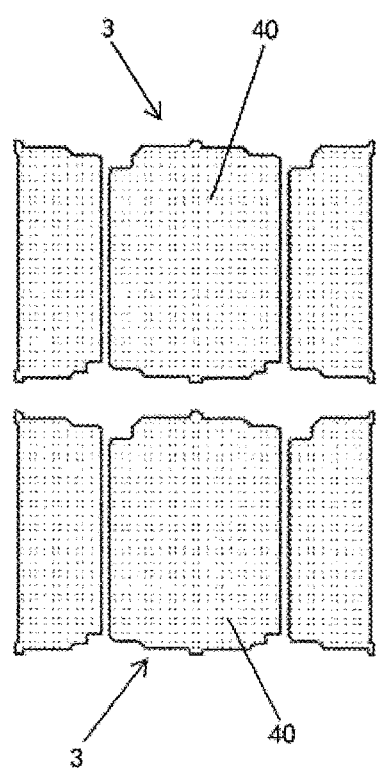
FIGS. 4-8 are schematic views showing processes for manufacturing the pixel structure in FIG. 1 according to an embodiment of the present disclosure.
Figure 9:
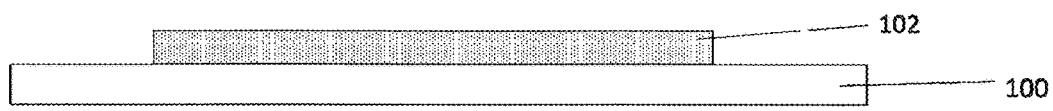
FIGS. 9-17 are schematic cross-section views showing various layers of the pixel structure formed in various steps of the manufacturing method of the pixel structure according to an embodiment of the present disclosure, in which some detailed structures in various layers are omitted for clear illustration.

Firstly, a glass substrate 100 is prepared, and a transparent common electrode layer 102 is deposited on the glass substrate 100, for example, through a sputtering process, as shown in FIG. 9. The common electrode layer may be formed from common material such as ITO, IZO or the like. Then, the common electrode layer is patterned through photoetching processes such as exposure, development, etching and the like, for example, by using a mask, so as to form a common electrode pattern as shown in FIG. 4. FIG. 4 only shows a part of common electrodes 40, and those skilled in the art can understand that the common electrode pattern in FIG. 4 may extend in both the horizontal and vertical directions.

Figure 10:
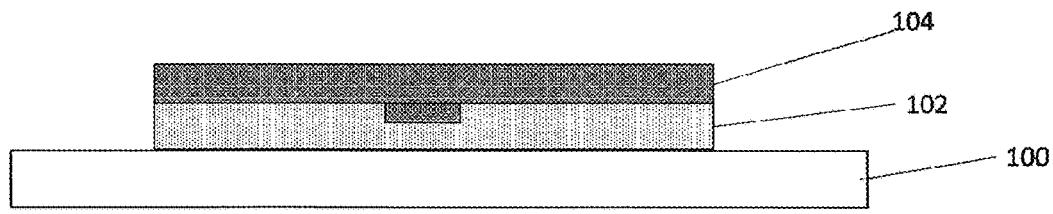
Figure 11:
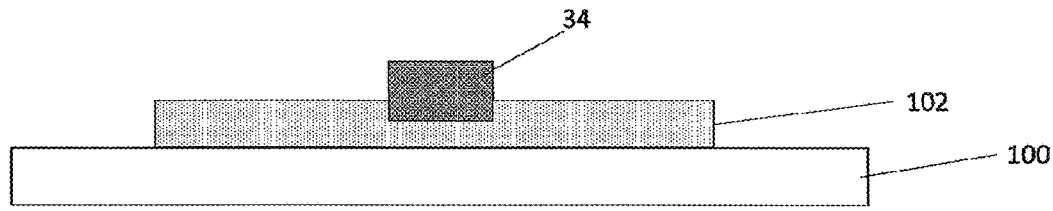

Next, a first conductive metal layer 104 is manufactured on the common electrode layer on which the common electrode pattern has been formed, through an evaporation process, a magnetron sputtering process or the like, as shown in FIG. 10. The first metal layer may be formed from material such as Mo, Cu, Cr, Al, Ag, etc. Then, the conductive metal layer is patterned through photoetching processes such as exposure, development, etching and the like, for example, by using a mask, so as to form a gate line 1, a gate electrode 51 (see FIG. 2) of a TFT connected with the gate line 1, a first common electrode line 33 and a second common electrode line 34, as shown in FIGS. 5 and 11. In an embodiment, two gate lines 1 are formed between the two pixel units 3 which are adjacent to each other in the vertical direction. The first common electrode line 33 is continuously formed along a top edge of each pixel unit 3, and the second common electrode line 34 extends along a boundary between two pixel regions 31, 32 of each pixel unit. Specifically, the second common electrode line 34 extends along a vertically symmetric line of the pixel unit 3 so as to reduce a common resistance in the second direction, as shown in FIG. 3.

Figure 12:
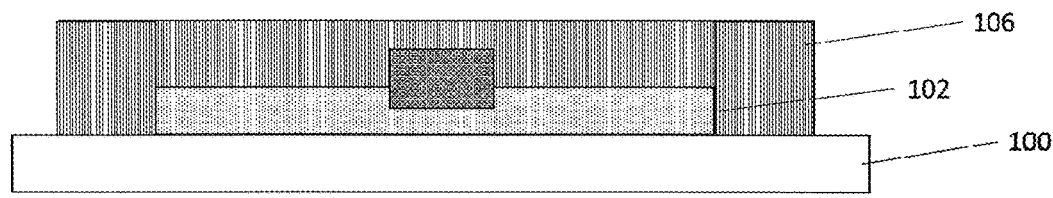

Next, a gate insulation layer 106 is manufactured on the first patterned metal layer through chemical vapor deposition (CVD), as shown in FIG. 12. The gate insulation layer may be formed from material such as silicon nitride, silicon oxide, etc.

Figure 13:
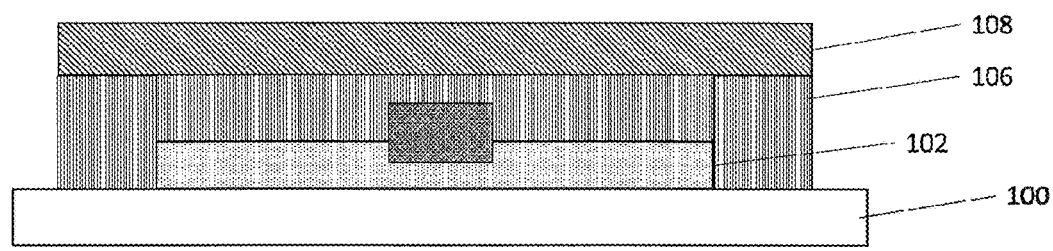
Figure 14:
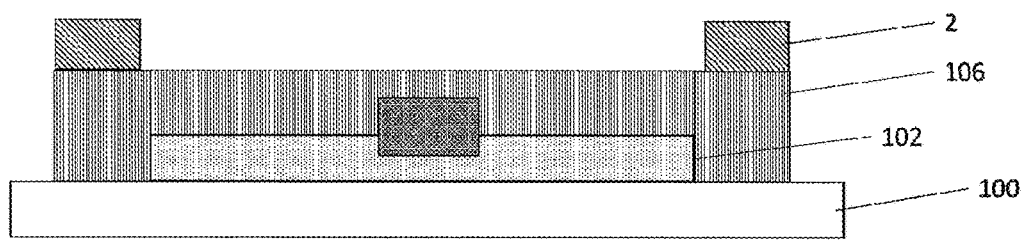

Next, a channel layer (not shown) is manufactured on the gate insulation layer 106 through CVD, and a second metal layer 108 is manufactured above the channel layer through a process such as magnetron sputtering or the like, as shown in FIG. 13. The channel layer may be formed from material such as polysilicon, low temperature polysilicon or the like, and the second metal layer may be formed from material such as Mo, Al, Cu, Ag or the like. Then, the channel layer and the second metal layer are patterned through photoetching processes by using a semi-transparent mask, so as to form a data line 2, a source electrode 52 (see FIG. 6) and a drain electrode 53 (see FIG. 2) of the TFT and the like. One data line 2 is formed between the pixel units 3 which are adjacent to each other in the horizontal direction, as shown in FIGS. 6 and 14.

Figure 15:
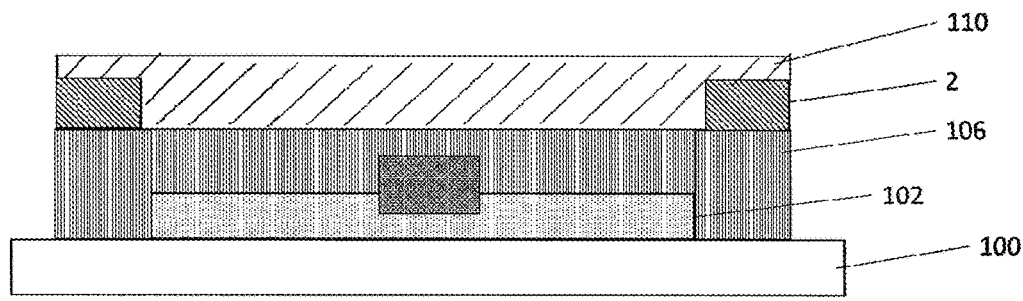

Next, an insulated passivation layer 110 is manufactured on the second patterned metal layer through CVD, as shown in FIG. 15. The passivation layer may be formed from material such as silicon nitride, silicon oxide or the like. Then, the passivation layer is patterned through photoetching processes by using a mask so as to form a via-hole 37 which penetrates the passivation layer to connect the drain electrode of the TFT with the pixel electrode and a via-hole 35 which penetrates the passivation layer and the gate insulation layer to connect the second common electrode lines 34, as shown in FIG. 7.

Figure 16:
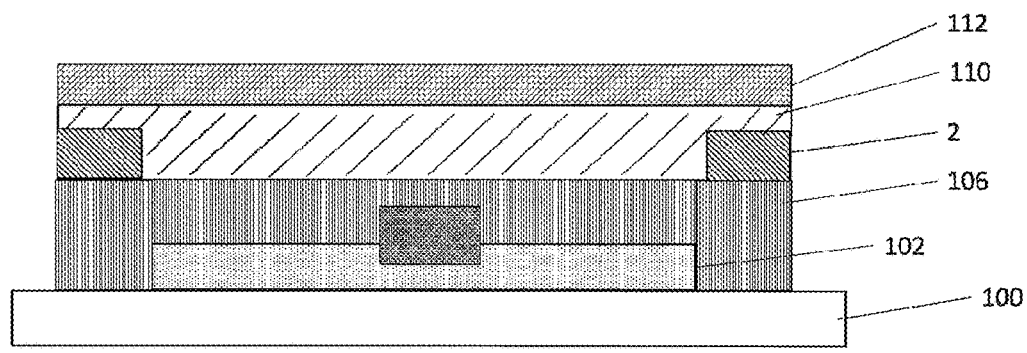
Figure 17:
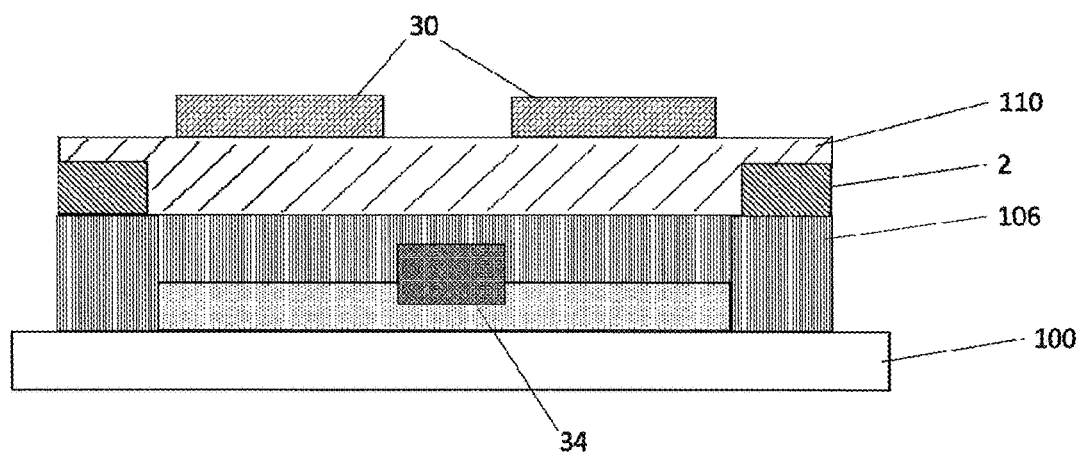

Next, a transparent pixel electrode layer 112 is manufactured on the passivation layer through a process such as evaporation, magnetron sputtering or the like, as shown in FIG. 16. The pixel electrode layer may be formed from material such as indium oxide, indium tin oxide or other transparent oxides. Then, the pixel electrode layer 112 is patterned through photoetching processes by using a mask, so as to form patterns of a pixel electrode 30 and a connecting line 36 for connecting the second common electrode lines 34, as shown in FIGS. 8 and 17. As a result, the pixel structure as shown in FIGS. 8 and 17 is substantially formed.

The pixel structure and the display panel according to embodiments of the present disclosure have the following advantages: with regard to the dual-gate driving pixel structure in which the data lines are halved and the gate lines are doubled, the common electrodes of adjacent pixels are connected together to form a unitary structure so that common voltage of the adjacent pixels may be balanced, as a result, a brightness variance in low gray scale and a flashing defect due to a difference in common voltage between adjacent pixels may be alleviated or eliminated, thereby improving a product quality.

Further, the common electrode lines formed of gate metal layer extend in the horizontal and vertical directions to form a common electrode line grid in a display region, so as to reduce an integral resistance in a display panel and improve a distribution of integral common electrode resistances in the display panel, thereby improving a product quality, in particular, alleviating or eliminating some defects such as greenish, image sticking defects, or the like.

The above embodiments only explain the principle and configuration of the present disclosure exemplarily, but do

What is claimed is:

1. A pixel structure, comprising:
a plurality of gate lines extending in parallel in a first direction;
a plurality of data lines extending in parallel in a second direction; and
a plurality of pixel units defined by the plurality of gate lines and the plurality of data lines, wherein,
one of the data lines is disposed between each two pixel units which are adjacent to each other in the first direction, and two of the gate lines are disposed between each two pixel units which are adjacent to each other in the second direction; wherein,
each of the pixel units comprises two pixel regions which are arranged side by side in the first direction, each of the pixel regions comprises a pixel electrode, and each of the pixel units comprises a unitary common electrode which covers the two pixel regions; and wherein,
each of the pixel units comprises a first common electrode line extending in the first direction and a second common electrode line extending in the second direction, the common electrode is positioned in a common electrode layer, and the first common electrode line and the second common electrode line are electrically connected with the common electrode, respectively.

2. The pixel structure according to claim 1, wherein,
the first common electrode line and the second common electrode line are electrically connected with each other at their intersection point; and wherein,
the first common electrode lines of the pixel units which are adjacent to each other in the first direction are electrically connected with each other, and the second common electrode lines of the pixel units which are adjacent to each other in the second direction are electrically connected with each other.

3. The pixel structure according to claim 2, further comprising a first metal layer, a pixel electrode layer and an insulation layer between the first metal layer and the pixel electrode layer, wherein,
the first common electrode line, the second common electrode line and the gate line are positioned in the first metal layer,
the pixel electrode is positioned in the pixel electrode layer,
the first common electrode lines of the pixel units which are adjacent to each other in the first direction extend continuously in the first metal layer, so as to be electrically connected with each other, and
the second common electrode lines of the pixel units which are adjacent to each other in the second direction are broken off by the gate lines, the second common electrode lines of the pixel units which are adjacent to each other in the second direction are electrically connected with each other through a via-hole in the insulation layer and a connecting line in the pixel electrode layer, and the connecting line spans the gate lines between the two pixel units which are adjacent to each other in the second direction.

4. The pixel structure according to claim 3, wherein the connecting line is formed from the same material as the pixel electrode.

5. The pixel structure according to claim 3, wherein,
each of the pixel regions comprises a thin film transistor,
a gate electrode of each thin film transistor is electrically connected with a gate line, a source electrode of each thin film transistor is electrically connected with a data line, and a drain electrode of each thin film transistor is electrically connected with a pixel electrode of the pixel region where the thin film transistor is located through a via-hole, and
the gate electrodes of the respective thin film transistors in the two pixel regions of each pixel unit are electrically connected with the gate lines at two sides of the pixel unit, respectively.

6. The pixel structure according to claim 5, wherein,
the respective thin film transistors in the two pixel regions of each pixel unit are diagonally arranged at two corners of the pixel unit.

7. The pixel structure according to claim 5, further comprising a second metal layer formed between the first metal layer and the pixel electrode layer, wherein the data line, the source electrode and the drain electrode of the thin film transistor are positioned in the second metal layer.

8. The pixel structure according to claim 7, wherein an insulation layer is provided between the first metal layer and the second metal layer, and between the second metal layer and the pixel electrode layer, respectively.

9. The pixel structure according to claim 3, wherein the first common electrode line, the second common electrode and the gate line are formed from the same material.

10. The pixel structure according to claim 2, wherein,
the first common electrode line is arranged in the first direction at an edge of each of the pixel units, and the second common electrode line is arranged in the second direction at a boundary between two pixel regions.

11. The pixel structure according to claim 2, wherein the first common electrode lines of the respective pixel units are aligned with each other, and the second common electrode lines of the respective pixel units are aligned with each other.

12. A display panel comprising the pixel structure according to claim 1.

13. A manufacturing method of a pixel structure, comprising:
providing a substrate;
forming a common electrode layer on the substrate, and patterning the common electrode layer to form a common electrode;
forming a first metal layer on the common electrode layer, and patterning the first metal layer to form a plurality of gate lines extending in parallel in a first direction, a plurality of first common electrode lines extending in the first direction and a plurality of second common electrode lines extending in a second direction, wherein the first common electrode lines and the second common electrode lines are electrically connected with each other at their intersection points;
forming a first insulation layer on the first metal layer;
forming a second metal layer on the first insulation layer, and patterning the second metal layer to form a plurality of data lines extending in parallel in the second direction;

forming a second insulation layer on the second metal layer; and forming a transparent pixel electrode layer on the second insulation layer, and patterning the pixel electrode layer to form a pixel electrode; wherein, the plurality of gate lines and the plurality of data lines define a plurality of pixel units, one of the data lines is disposed between each two pixel units which are adjacent to each other in the first direction, and two of the gate lines are disposed between each two pixel units which are adjacent to each other in the second direction; wherein, each of the pixel units comprises two pixel regions which are arranged side by side in the first direction, each of the pixel regions comprises a pixel electrode, and each of the pixel units comprises a unitary common electrode which covers the two pixel regions; and wherein, the first common electrode line and the second common electrode line are formed such that the first common electrode line and the second common electrode line contact electrically with the common electrode, respectively.

14. The manufacturing method according to claim 13, wherein, each of the pixel units comprises a corresponding first common electrode line and a corresponding second common electrode line; and wherein, the first common electrode lines of the pixel units which are adjacent to each other in the first direction are electrically connected with each other, and the second common electrode lines of the pixel units which are adjacent to each other in the second direction are electrically connected with each other.

15. The manufacturing method according to claim 14, further comprising: forming a source electrode and a drain electrode of a thin film transistor while patterning the second metal layer to form the data line.

16. The manufacturing method according to claim 15, further comprising:

patterning the second insulation layer to form a first via-hole which penetrates the first insulation layer and the second insulation layer and a second via-hole which penetrates the second insulation layer to connect the drain electrode of the thin film transistor with the pixel electrode.

17. The manufacturing method according to claim 16, further comprising: forming a connecting line while patterning the pixel electrode layer to form the pixel electrode, wherein the connecting line spans the gate lines between the pixel units which are adjacent to each other in the second direction.

18. The manufacturing method according to claim 17, wherein, the first common electrode lines of the pixel units which are adjacent to each other in the first direction extend continuously in the first metal layer, so as to be electrically connected with each other, and the second common electrode lines of the pixel units which are adjacent to each other in the second direction are broken off by the gate lines, and are electrically connected with each other through the first via-hole which penetrates the first insulation layer and the second insulation layer and the connecting line in the pixel electrode layer.

\* \* \* \* \*